United States Patent [19]

Chakrabarty et al.

[11] 4,084,314

[45] Apr. 18, 1978

[54] PRODUCING THICK FILM CIRCUITS HAVING TERMINAL ELEMENTS

[75] Inventors: Naresh Chakrabarty, Germering; Artur Weitze, Munich, both of Germany

[73] Assignee: Siemens Aktiengesellschaft, Berlin & Munich, Germany

[21] Appl. No.: 770,368

[22] Filed: Feb. 22, 1977

[30] Foreign Application Priority Data

Feb. 20, 1976 Germany .............................. 2606963

[51] Int. Cl.$^2$ .......................... H05K 3/30; H05K 3/34
[52] U.S. Cl. ........................................ 29/626; 29/625; 174/68.5; 228/180 R; 228/219; 228/238; 427/190; 427/191
[58] Field of Search ................. 29/625, 626; 174/68.5; 228/180 R, 238, 219; 427/190, 191

[56] References Cited

U.S. PATENT DOCUMENTS

| 3,374,110 | 3/1968 | Miller | 29/626 |
|---|---|---|---|
| 3,714,709 | 2/1973 | Liederbach | 29/626 |
| 3,904,461 | 9/1975 | Estep et al. | 29/625 X |

*Primary Examiner*—Victor A. DiPalma
*Attorney, Agent, or Firm*—Hill, Gross, Simpson, Van Santen, Steadman, Chiara & Simpson

[57] ABSTRACT

A process for producing a thick film circuit with terminal elements on an inorganic substrate. A paste of silver powder, copper oxide powder and organic bonding agent is silk screen printed on an inorganic substrate, dried and sintered. Then over preselected locations along individual conductor paths terminal elements are hard soldered. The conductor paths are strongly adhered to the inorganic substrate and the terminal elements are likewise strongly adhered to the individual conductor paths.

26 Claims, No Drawings

PRODUCING THICK FILM CIRCUITS HAVING TERMINAL ELEMENTS

BACKGROUND OF THE INVENTION

From West German Pat. No. 1,963,286, it is known that conductive structures on ceramic substrates can be produced by silk screen printing. Such structures are to be accurate with respect to their individual geometric structures, and also are to be hard-solderable after undergoing a sintering operation. To this end, a metal-powder-paste is used initially which is suitable for silk-screen printing and which has thixotropic properties. The silk-screen printing paste used contains particles of heavy metal, such as, for example, molbydenum with manganese silicate powder having a granule size of less than 5 microns. Structures produced in this way nevertheless possess a comparatively high sintering temperature, the sintering process being carried out in a controlled atmosphere. In order to improve the flow behaviour of the hard solder, the conductive paths must also be provided with, for example, a nickel layer galvanically prior to the hard soldering. It is also necessary to subject the applied nickel layer to a diffusion annealing process in order to improve the adhesion of the nickel layer to the base layer.

In accordance with West German Offenlegungsschrift No. 2,021,362, metallization masses are also known which, in addition to alkali salts, contain up to 95 weight percent silver; these masses serve, for example, to produce conductor paths which are to be applied onto glass plates. Such a mass is likewise applied by silk-screen printing to such a glass base and then after drying is fired. However, such a mass possesses a comparatively low bonding capacity; also, it is not suitable for hard soldering.

Also known are so-called active silver solders, consisting, for example, of 96 weight percent Ag and 4 weight percent CuO on a total weight basis. These solders have the property of forming sub-oxides at their contact interface with oxide ceramic bodies. The adhesive strength of the solder to the substrate body material is very high due to the formation of these sub-oxides. Such solders are used to connect metal components to ceramic material. A solder of this type would also be suitable to secure terminal elements to a ceramic carrier plate. However, it is not possible to provide the printed thick-film conductor paths formed from noble metals, such as Ag, Pd, Au/Pd, or the like, with terminal elements by means of such an active silver solder because the respective solder and conductor path materials are not compatible with one another. Thus, during a hard soldering, the conductor path material immediately alloys with the solder; the adhesion is discontinued. Also, it is not possible to use such an active silver solder to contact terminal elements already secured on a ceramic substrate to a circuit of thick-film conductor paths, since the terminal elements and the solder would not endure the sintering process needed to produce the conductor paths.

BRIEF SUMMARY OF THE INVENTION

Briefly, this invention relates to a process for the production of a thick-film circuit with terminal elements on an inorganic substrate, preferably an oxide ceramic substrate, wherein a paste-like suspension, comprising a powder mixture containing silver dispersed in an organic bonding agent, is applied to the substrate, most preferably by silk screen printing, to produce a desired circuit, and the circuit so applied in this way is fixed to the substrate in a further process step by sintering, and then, in a final process step, with an eutectic copper-silver solder interveningly applied, desired terminal elements are hard-soldered to selected conductor paths in the circuit.

The present invention avoids the above-mentioned disadvantages, and aims to provide a thick-film circuit in which the individual conductor paths possess a high adhesive strength to a carrier substrate composed of a highly insulative material, and in which the interfacial region of electrical interconnection between individual conductor paths and individual terminal elements hard soldered thereto exhibit a correspondingly high degree of strength. This aim is realized in accordance with this invention by employing a particular type of powder mixture which when sintered adhers to a substrate and which can be formulated into a composition suitable for silk screen printing of the conductor paths.

Such powder mixture comprises copper oxide particles and silver powder. Preferably, such powder mixture comprises from about 92 to 96 weight percent silver and from about 4 to 8 weight percent of copper oxide (CuO) on a 100 weight percent total powder weight basis. A powder mixture comprised of about 94 weight percent Ag and about 6 weight percent CuO (same basis) is particularly advantageous.

When such a powder mixture is suitably applied as taught herein to a substrate, one obtains a thick-film circuit whose component conductor paths both possess a high adhesive strength to the material of the substrate (typically a plate) and also to the individual terminal elements. The electric conductivity of the conductor paths produced in this way is surprisingly good, for example, the quadratic surface resistance $R_F$ characteristically amounts at the maximum to about $10^{-3}$ ohm.

DETAILED DESCRIPTION

The individual conductor paths are conveniently and preferably, applied to a substrate in known manner by silk screen printing. After such an applied circuit layer has been dried, for example, in air at ambient temperature, or in an air drying furnace at about 60° C, sintering is carried out in air preferably at temperatures ranging from about 930° to 935° C. The subsequent hard soldering of terminal elements is carried out, for example, in a nitrogen, argon, or other inert gas atmosphere. Between the components which are thus to be connected are placed pre-punched, thin solder plates consisting, for example, of an eutectic solder formed from Cu and AG. The relative positions of circuit conductor paths, terminal elements, and solder plates relative to one another is secured by means of a clamping device. The assembly is then heated to the hard soldering temperature of about 820° C with a temperature rise preferably of about 164° C per minute. In order to avoid tensions, the substrate is then slowly cooled, for example, preferably at about 14° to 40° C per minute.

For a composition of a starting suspension employed in the practice of this invention, one uses a silver powder which has a particle size of from about 1 to 10 microns. Such powder is conveniently dry-blended uniformly with the copper oxide powder initially, the particle size of the copper oxide powder is less than about 2 microns. Such a silver and copper oxide mixture is mixed with preferably about 35 weight percent of a viscous organic bonding agent (on a total product suspension weight basis). This suspension is then homogenized, for example, by means of a roller frame. Suitable organic bonding agents are known solutions, such as, for example, 10 weight percent ethyl cellulose in 90 weight percent terpineol (from the Fluka AG, Buchs, Switzerland) mixture on a 100 weight percent total bonding agent weight basis, or 10 weight percent nitrocellulose in 90 weight percent butylcarbitol [2 (2-Butoxyaethoxy)aethanol] (same basis). The viscosity of a product suspension or paste produced in ths way is characteristically suitable for screen printing, e.g. "Thick Film Hybrid Microcircuit Techology" by Donald W. Hamer and James V. Biggers, Chapter 5, p. 95, on ceramic substrate bodies.

It is advantageous and preferred in this invention to have conductor paths with a minimum thickness of about 35 microns. Such a thickness permits a good mixing, and thus an intimate connection, of hard solder at the interface between an individual terminal element and an adjacent conductor path. A 105 mesh screen is conveniently used to produce such a thick conductor path structure of this type. It is also possible to interconnect such a thick conductor path with terminal elements formed from a different material, such as, for example, copper, by hard soldering, without the preliminary insertion of a solder foil therebetween; a copper-silver eutectic is then formed inherently during a hard soldering heating process (cycle) when such a copper layer is in direct contact with such a conductor path.

Preferably, the process of the invention is conveniently used for producing thick-film circuits on a carrier plate formed from an oxide ceramic such as aluminum oxide, beryllium oxide, or the like. However, the process can also be used with the indicated advantages when the carrier plate is formed from a crystal, such as ruby, or sapphire.

In producing a thick film circuit with terminal elements on an inorganic substrate by the present invention, one, in effect, applies a metal powder layer to predetermined localized surface portions of a selected inorganic substrate. The metal powder is as characterized above. Then, one sinters such so applied metal powder layer at a temperature ranging from about 930° to 935° C. Finally, one hard solders to predetermined locations over individual conductor paths a plurality of respective individual terminal elements at a temperature typically of about 820° C. The metal powder is so applied as a suspension in combination with a minor amount of an organic bonding agent which agent is characterized by a capacity to combust substantially completely without ash during said sintering. A liquid carrier in said suspension is evaporated after said metal powder is so applied and before said sintering. In one preferred operational mode, the sintering is carried out at a heating speed of about 75° C per minute, until such sintering temperature is reached, and such temperature is maintained for a time of about 1 minute, whereupon cooling is undertaken at a cooling speed of 60° C down to room temperature.

Preferably, the substrate is inorganic, is comprised of an electrically insulative material, and has a melting temperature above 1200° C. One applies by silk screen printing such a suspension to such substrate to form a predetermined circuit pattern on one face thereof.

Such a suspension comprises initially on a 100 weight percent total weight basis:

(a) From about 55 to 70 weight percent of a particulate metal mixture, (b) from about 1 to 10 weight percent of a combustible, substantially ash free organic bonding agent, and (c) from about 20 to 44 weight percent of an organic solvent which evaporates substantially completely at temperatures below about 100° C.

The particulate metal mixture in such a suspension is as characterized above. After application, one dries the resulting said circuit pattern at a temperature broadly ranging from about 20 to 100° C. Thereafter, one sinters said so dried circuit pattern at a temperature of from about 930° to 935° C for a time of from about 1 to 5 minutes. The interrelationship between said applying, said drying and said sintering being such that individual conductor paths in said circuit pattern have vertical thicknesses relative to said one face of at least about 35 microns.

Next, one positions a solder plate over each location along said individual conductor paths in such resulting so sintered circuit pattern whereat an individual terminal element is to be located. Such a solder plate is a eutectic alloy comprised of silver and copper and having a melting point of 780° C. Also, such a solder plate has a vertical thickness relative to such conductor paths and the substrate of from about 50 to 100 microns.

Then, one places an individual terminal element over the solder plate at each such location. One holds the assembly comprising said individual terminal elements, said solder plate, and said substrate in such desired interrelationship with a jig, clamp or the like.

Alternatively, when the individual terminal elements are comprised of copper, one can directly position an individual such terminal element over each location along individual conductor paths whereat an individual such terminal element is to be located and this resulting assembly is maintained in the desired element interrelationship with a jig, clamp or the like.

Finally, one heats such assembly as so held to a temperature of about 820° C for a time which is sufficient to hard solder said individual terminal elements to said individual respective conductor paths (which is typically a time of from about 1 to 5 minutes).

Preferably, during such heating, such assembly is raised to such temperature at the rate of from about 75° to 170° C per minute, and is lowered from such temperature at the rate of about 14° to 40° C per minute. More preferably during such heating such assembly is maintained at such temperature for about 1 minute.

Preferably, such substrate is an oxide ceramic, such as one comprised of aluminum oxide or beryllium oxide.

Preferably such an organic bonding agent is dissolved in such a carrier liquid. Preferably such said organic bonding agent is selected from the group consisting of cellulose and cellulose derivatives.

A particularly preferred bonding agent is a lower alkyl cellulose such as ethyl cellulose ("lower" here designates less than 4 carbon atoms per alkyl group). Another preferred bonding agent is a nitrocellulose.

No particular criticality is associated with a carrier liquid. A carrier liquid should preferably be inert towards other components present. It can be, for example, a hydrocarbon, a cyclic alcohol isomer mixture, an aliphatic alcohol, an aliphatic ketone, an aliphatic ether, or the like.

EMBODIMENTS

The present invention is further illustrated by reference to the following examples. Those skilled in the art will appreciate that other and further embodiments are obvious and within the spirit and scope of this invention from the teachings of these present examples taken with the accompanying specification.

EXAMPLE 1

Silver particles in the size range of from about 1 to 10 microns are dry blended with copper oxide (CuO) particles to form a particle mixture comprised on a 100 weight percent total weight basis of 94 weight percent silver and 6 weight percent copper oxide.

Separately, on a 100 weight percent total solution basis a 10 weight percent solution of ethyl cellulose in a 90 weight percent solvent medium (100 weight percent total solution basis) is prepared. The ethyl cellulose is available commercially from the Fluka AG, Buchs, Switzerland, under the trade designation Ethocel, purum, 50 cps.

Next, a homogeneous suspension comprising 65 weight percent of such particle mixture and 35 weight percent of such solution is prepared using a roller frame. This suspension has a viscosity of about 62,000 centipoises (at 25° C. by Gardner-Holdt).

EXAMPLE 2

An aluminum oxide ceramic plate is silk screen printed on one face thereof with a test circuit using a 105 mesh screen after which the resulting plate is air dried in an oven at 60° C. for 1½ hours. Thereafter, the so-dried plate is transferred to a furnace and sintered in air at a temperature of 930° to 935° C for about 1 minute.

After cooling, the plate is found to have a test circuit on the silk screened face thereof whose individual conductor paths are bonded to the ceramic plate face by a high adhesive strength, and whose individual conductor paths are each at least 35 microns in thickness (measured normally to the plate face). The quadratic surface resistance $R_F$ of the circuit is not greater than $10^{-3}$ ohm.

EXAMPLE 3

Using the ceramic plate and test circuit described in Example 2, a prepunched solder plate is prepared wherein regions of the solder plate overlie a plurality of specific locations along particular conductor paths in the test circuit whereat it is desired to affix, at each respective such location, a terminal element. The solder plate consists essentially of a copper and silver eutectic, and the solder plate is about 80 microns in thickness. With the solder plate in position, a terminal element is positioned at each such location in contact with such plate. The entire assembly is maintaining with components in desired relation relative to one another by a jig arrangement. This assembly is then heated at the rate of about 164° C per minute above the eutectic point 780° C of Ag/Cu to about 820° C (the hard soldering temperature and then is maintained at this temperature for about 1 minute. Thereafter, this assembly is cooled at the rate of about 14 to 40° C per minute to room temperature.

After cooling, the plate is found to have the individual terminal elements all functionally soldered to their respective such locations. The individual terminal elements are each bonded to their respective conductor paths by a high adhesive strength which is at least as great as the adherive strength of the conductor paths to the ceramic substrate.

We claim:

1. A process for the production of a thick film circuit with terminal elements on an inorganic substrate comprising the steps of (A) applying a metal powder layer to predetermined localized surface portions of said substrate, said metal powder comprising on a 100 weight percent total powder weight basis from about 92 to 96 weight percent of silver having a particle size of from about 1 to 10 microns, and from about 4 to 8 weight percent of copper oxide having a particle size of less than about 2 microns, (B) sintering said metal powder layer at a temperature of from about 930° to 935° C., and (C) hard soldering to predetermined locations over individual conductor paths a plurality of respective individual terminal elements at a temperature of about 820° C.

2. The process of claim 1 wherein said metal powder is so applied as a suspension in combination with a minor amount of an organic bonding agent which is characterized by a capacity to combust substantially completely without ash during said sintering.

3. The process of claim 1 wherein a liquid carrier in said suspension is evaporated after said metal powder is so applied and before said sintering.

4. The process of claim 1 wherein said sintering is carried out at a heating speed of about 75° C per minute, until said temperature is reached, and said temperature is maintained for a time of about 1 minute, whereupon cooling is undertaken at a cooling speed of 60° C per minute, down to room temperature.

5. A process for producing a thick-film circuit on an inorganic substrate comprising the steps of (A) applying by silk screen printing a suspension to an inorganic substrate to form a predetermined circuit pattern on one face of said substrate,
 (1) said substrate being comprised of an electrically insulative material and having a melting temperature above 1200° C.,
 (2) said suspension comprising initially on a 100 weight percent total weight basis
  (a) from about 55 to 70 weight percent of a particulate metal mixture,
  (b) From about 1 to 10 weight percent of combustible, substantially ash free organic bonding agent, and
  (c) from about 20 to 44 weight percent of an organic carrier liquid which evaporates substantially completely at temperatures below about 100° C.,
 (3) said particulate metal mixture comprising on a 100 weight percent total weight basis
  (a) from about 92 to 96 weight percent of silver having a particle size of from 1 to 10 microns, and
  (b) from about 4 to 8 weight percent of copper oxide having a particle size of less than about 2 microns, (B) drying the resulting said circuit pattern at a temperature ranging from about 20° to 100° C., (C) sintering said so dried circuit pattern at a temperature of from about 930° to 935° C for a time of from about 1 to 5 minutes, the interrelationship between said applying, said drying and said sintering being such that individual conductor paths in said circuit pattern have vertical thicknesses relative to said one face of at least about 35 microns, (D) positioning a solder plate over each location along said individual conductor paths in such resulting so sintered circuit pattern whereat an individual terminal element is to be located, said solder plate being a eutectic alloy comprised of silver and copper and having a melting point of about 820° C., said solder plate having a vertical thickness relative to said conductor paths of from about 50 to 100 microns, (E) placing an individual terminal element over said solder plate at each said location, (F) holding the assembly comprising said individual terminal elements, said solder plate, and said substrate in such desired interrelationship, and (G) heating said assembly as so held to a temperature of about 820° C for a time sufficient to hard solder said individual terminal elements to said individual respective conductor paths.

6. The process of claim 5 wherein, during said heating, said assembly is raised to said temperature at the rate of from about 75° to 170° C. per minute, and is lowered from said temperature at the rate of about 14° to 40° C per minute.

7. The process of claim 5 wherein, during said heating said assembly is maintained at said temperature for about 1 minute.

8. The process of claim 5 wherein said substrate is an oxide ceramic.

9. The process of claim 8 wherein said substrate is selected from the group consisting of aluminum oxide and beryllium oxide.

10. The process of claim 5 wherein said substrate is crystalline in structure.

11. The process of claim 10 wherein said substrate is selected from the group consisting of ruby and sapphire.

12. The process of claim 5 wherein said particulate metal mixture comprises about 94 weight percent silver and about 6 weight percent copper oxide (same basis).

13. The process of claim 5 wherein said organic bonding agent is dissolved in said carrier liquid.

14. The process of claim 13 wherein said organic bonding agent is selected from the group consisting of cellulose and cellulose derivatives.

15. The process of claim 14 wherein said organic bonding agent is a lower alkyl cellulose.

16. The process of claim 14 wherein said organic bonding agent is a nitro cellulose.

17. The process of claim 13 wherein said carrier liquid is a hydrocarbon.

18. The process of claim 13 wherein said carrier liquid is a cyclic alcohol isomer mixture.

19. The process of claim 13 wherein said carrier liquid is an aliphatic alcohol.

20. The process of claim 13 wherein said carrier liquid is an aliphatic ketone.

21. The process of claim 13 wherein said carrier liquid is an aliphatic ether.

22. A process for producing a thick-film circuit on an inorganic substrate comprising the steps of (A) applying by silk screen printing a suspension to a substrate to form a predetermined circuit pattern on one face of said substrate,
  (1) said substrate being comprised of an electrically insulative inorganic material and having a melting temperature above 1200° C.,
  (2) said suspension comprising initially on a 100 weight percent total weight basis
    (a) from about 55 to 70 weight percent of a particulate metal mixture,
    (b) from about 1 to 10 weight percent of a combustible, substantially ash free organic bonding agent, and
    (c) from about 20 to 44 weight percent of an organic carrier liquid which evaporates substantially completely at temperatures below about 100° C.,
  (3) said particulate metal mixture comprising on a 100 weight percent total weight basis
    (a) from about 92 to 96 weight percent of silver having a particle size of from about 1 to 10 microns, and
    (b) from about 4 to 8 weight percent of copper oxide having a particle size of less than about 2 microns, (B) drying the resulting said circuit pattern at a temperature ranging from about 20 to 100° C., (C) sintering said so dried circuit pattern at a temperature of from about 930° to 935° C, for a time of from and 1 to 5 minutes, the interrelationship between said applying, said drying and said sintering being such that individual conductor paths in said circuit pattern have vertical thicknesses relative to said one face of at least about 35 microns, (D) positioning an individual copper terminal element over each location along said individual conductor paths in such resulting so sintered circuit pattern whereat an individual such terminal element is to be located, (E) holding the assembly comprising said individual terminal elements, and said substrate in such desired interrelationship, and (F) heating said assembly as so held to a temperature of about 820° C. for a time sufficient to hard solder said individual terminal elements to said individual respective conductor paths.

23. The process of claim 5 wherein, during said heating, said assembly is raised to said temperature at the rate of from about 75° to 170° C. per minute, and is lowered from said temperature at the rate of about 14° to 40° C per minute.

24. The process of claim 5 wherein, during said heating said assembly is maintained at said temperature for about 1 minute.

25. The process of claim 5 wherein said substrate is an oxide ceramic.

26. The process of claim 5 wherein said particulate metal mixture comprises about 94 weight percent silver and about 6 weight percent copper oxide (same basis).

* * * * *